United States Patent

[11] 3,579,136

[72] Inventor George A. Machamer
10401 S. State St., Chicago, Ill. 60628
[21] Appl. No. 513,405
[22] Filed Dec. 13, 1965
[45] Patented May 18, 1971

[54] MULTI-STAGE POWER AMPLIFIER IN WHICH EACH STAGE CONDUCTS FOR ONLY A PREDETERMINED PORTION OF THE INPUT
7 Claims, 3 Drawing Figs.

[52] U.S. Cl. .......... 330/30, 330/22
[51] Int. Cl. .......... H03f 3/68
[50] Field of Search .......... 330/16, 22, 30, 124, 133, 134, 15

[56] References Cited

UNITED STATES PATENTS 2,764,680 9/1956 Walker et al. .......... 330/124X
3,225,209 12/1965 Schuster .......... 330/15X

FOREIGN PATENTS 209,265 1/1957 Australia .......... 330/134

*Primary Examiner*—John Kominski
*Assistant Examiner*—Lawrence J. Dahl
*Attorney*—Parker and Carter

ABSTRACT: An amplifying circuit made up of a plurality of individual amplifying stages, each of which may have at least three elements. Each of the amplifying stages have a common input and a common output and the stages are so biased that each amplifying stage conducts for a different portion of the input cycle. Although the output wave form is the same as if only a single stage were used, by providing a plurality of stages, each of which conducts for only a portion of the input cycle, a substantially more efficient power amplifier is provided.

Patented May 18, 1971 | 3,579,136

2 Sheets-Sheet 1

INVENTOR.
George A. Machamer,
BY Parker & Carter
Attorneys.

INVENTOR.
George A. Machamer,
BY Parker & Carter
Attorneys.

MULTI-STAGE POWER AMPLIFIER IN WHICH EACH STAGE CONDUCTS FOR ONLY A PREDETERMINED PORTION OF THE INPUT

This invention relates to a high efficiency power amplifier and in particular to an amplifier having a series of electronic amplifying devices or stages with each such stage conducting for only a predetermined portion of the input signal.

Another purpose is an amplifier of the type described utilizing transistors as the amplifying devices, with each transistor being biased to conduct only for a certain portion of the input signal.

Another purpose is an amplifier of the type described which may utilize conventional vacuum tubes as the amplifying devices, with each tube being biased to conduct for a different portion of the input cycle from the other tubes in the series.

Another purpose is a high efficiency amplifier of the type described in which each of the amplifying devices may be connected in any one of a number of circuit configurations.

Another purpose is a high efficiency amplifier of the type described in which each of the amplifying stages may be integral with each other, with one element of each stage being common.

Other purposes will appear in the ensuing specification, drawings and claims.

The invention is illustrated diagrammatically in the following drawings wherein.

Figure 1:
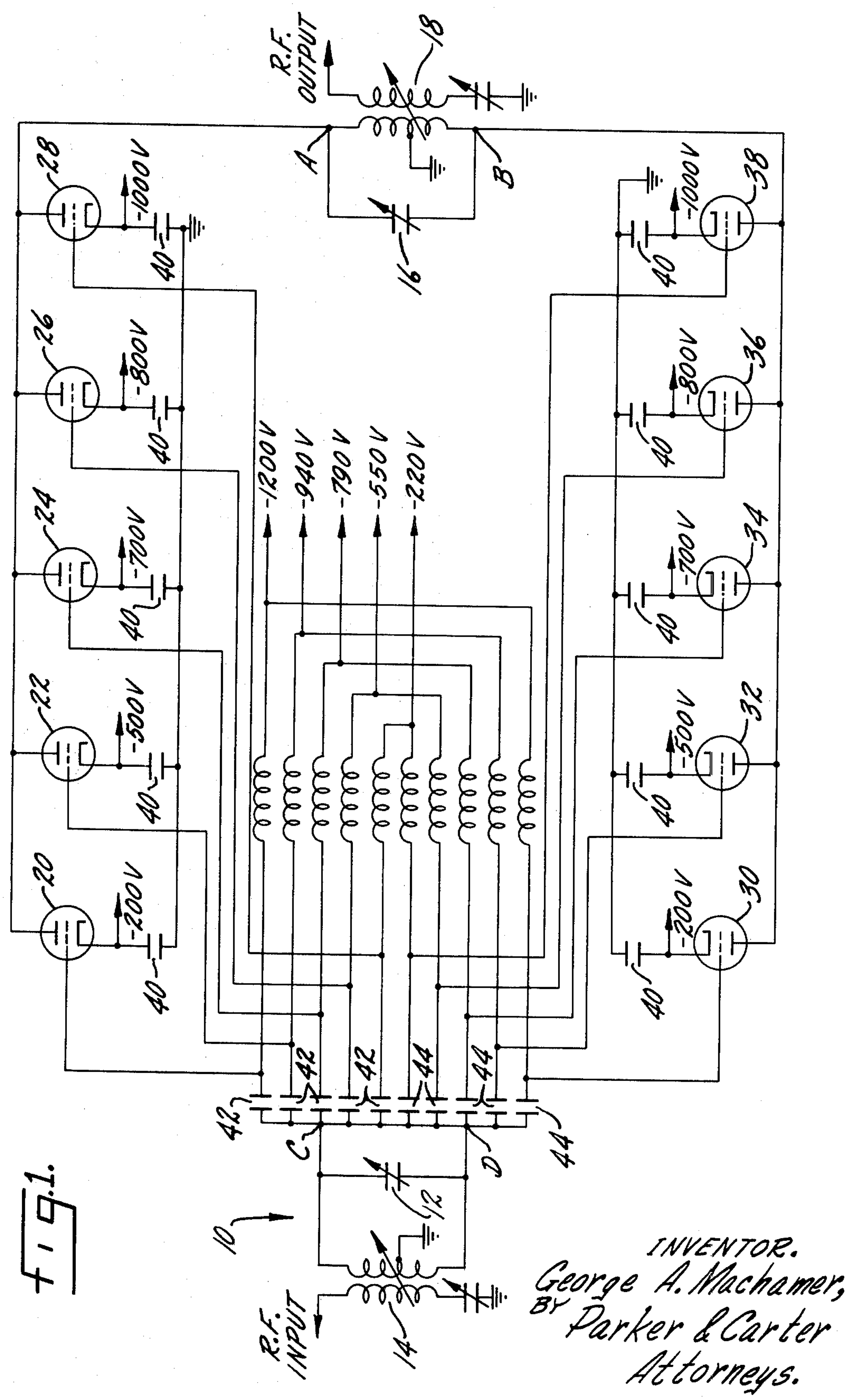
FIG. 1 is an electrical schematic illustrating one form of the invention.

This invention is directed to an amplifier circuit having an input, which may be a conventional tank circuit, and an output, which again may be a conventional tank circuit, with a succession of electronic amplifying devices or stages being connected between the input and output. The amplifying devices are biased so that each device conducts for a different portion of the input cycle. Stated another way, each amplifying device will conduct between predetermined amplitudes of the input signal, and in a conventional sine wave input, each of the amplifying devices would conduct in succession, with the output from the succession of devices being an amplified version of the input. The devices may be arranged to conduct such that as soon as one device goes out of conduction the succeeding device starts, or they may be arranged so that their periods of conduction overlap. There are many variations in the invention, but what is important is that the succession or plurality of electronic amplifying devices are biased so that each conducts only during certain amplitudes of the input signal. In this way, the conduction angle of each amplifying device remains small which permits greater power efficiency.

The invention is described in connection with separate semiconductors and tubes. The principles disclosed herein are equally applicable to components in which several amplifying stages or devices are made into a single integral unit, with one common element. Such an integral unit may be of the semiconductor type, of the vacuum tube type, or a unit including a single resonant cavity as the common element.

The amplifier disclosed herein obtains its efficiency through the use of small or minimum conduction angles for each amplifying device. The tubes, for purposes of illustration, are allowed to operate more in the nature of "on-off" switches. The smaller the conduction angle of a conventional radio frequency power amplifier, the greater will be the percentage of harmonics in the energy the tube supplies to the plate tank circuit. The harmonic energy of a conventional radio frequency power amplifier will be developed across the low reactance of the plate tank capacitor and the plate resistance of the tube, and will be dissipated as heat in the plate of the tube. Hence efficiency will suffer.

The problem of losing efficiency in a power amplifier by having the harmonics in each current pulse appear across the reactance of the plate tank capacitor and the plate resistance of the tube is greatly reduced by having two or more tubes deliver pulses of the proper amplitude and at the proper time to the plate tank circuit to excite it with power that takes a form similar to a sinusoidal wave form. For example, the power used to excite the plate tank could take the form of a series of individual and separate pulses, a form of pulses overlapping each other to any degree, or a form similar to a sine wave which would be formed when the peaks of the pulses are connected in turn by straight lines.

Turning to FIG. 1, an input circuit is indicated generally at 10 and may include a variable capacitor 12 and a variable transformer 14, as is conventional. The output circuit for the amplifier may include a tank circuit formed of a variable capacitor 16, and a second variable transformer 18, again as is conventional. Both the input and output circuits are tank circuits, although they could be otherwise. Between the input and output circuits are a plurality of tubes, each having an anode, cathode and grid, with the tubes being designated at 20, 22, 24, 26, 28, 30, 32, 34, 36 and 38. The plates of all of the tubes are connected to the tank circuit, with the plates of tubes 20—28 being connected to one side of the tank circuit, to point A, with the plates of tubes 30—38 being connected to the other tank circuit, at point B. The cathodes of all of the tubes are connected to a biasing voltage, with the biasing voltage being different for each tube. For example, starting with tube 20, the cathodes may be biased at voltages of −200 volts, −500 volts, −700 volts, −800 volts and −1000 volts. Tubes 30—38 may have the same cathode bias as tubes 20—28 as the amplifier arrangement shown is a push-pull configuration. The invention obviously should not be limited to a push-pull-type amplifier or to any of the voltages given as they are merely illustrative of one operating example. Each of the cathodes is then connected through a blocking condenser 40 to ground.

The grids of tubes 20—28 are connected through blocking condensers 42 to point C which is at one side of the input tank circuit. In like manner the grids of tubes 30—38 are connected through blocking condensers 44 to point D on the opposite side of the input tank circuit. The grids of all of the tubes are biased, at different voltages, much in the same manner as the cathodes of each of the tubes. Tubes 20 and 30 have −220 volts on their grids, tubes 22 and 32 have −550 volts on their grids, tubes 24 and 34 have −790 volts on their grids, tubes 26 and 36 have −940 volts on their grids, and tubes 28 and 38 have −1200 volts on their grids. Each of the bias voltages may be connected through a coil 46 to the respective grids.

Considering a typical cycle of operation, and considering that the input is a sine wave, initially point C will begin to rise in a positive direction with respect to point D. When the voltage at point C becomes positive with respect to the voltage at point D, tube 20 will conduct and this tube will continue to conduct until the voltage at the grid of tube 20 reaches about 20 volts. At this point, tube 20 will be at saturation. During the period that tube 20 was conducting, power is supplied to the output circuit and point A of the output circuit is going negative. About the time tube 20 reaches saturation, point A will have gone sufficiently negative to cut tube 20 off. At about the same time tube 22 will begin to conduct and it will normally conduct for the period when the voltage at point C is from about 20 to about 50 volts. When the voltage at point C has reached about positive 50 volts, tube 22 will be in saturation and the voltage at point A will be sufficiently negative to cut tube 22 off. The sequence will continue, assuming the input is a sine wave, until the peak of the sine wave voltage is reached and in the illustrative example, this would be when the voltage at point C reaches about 220 volts. As the voltage at point C begins to decrease on the downward side of the sine wave, the reverse series of conduction will take place and tube 26 will conduct after tube 28, followed by tubes 24, 22 and 20 in succession. When tube 20 again conducts, the voltage at point C will be decreasing from about 20 volts down to zero.

It should be understood that the typical cycle of operation described in which each tube is driven to saturation is only one example of the invention. Naturally circuits utilizing the invention may be operated in many ways. In like manner, it is not necessary that the output always be an amplified version of the input. In some applications the amplifier disclosed herein may only conduct for a portion of a cycle, for example 180°.

The above description has followed the operation of the amplifier circuit through the first 180° of an applied sine wave, and the same sequence of operations will result for the second 180°, except in this instance tubes 30—38 will successively conduct. Note in the case of tubes 30—38 that point D will be negative with respect to point C and point B will be positive with respect to point A. Note that the bias voltages on the two groups of tubes are the same, thus providing push-pull operation.

Figure 3:
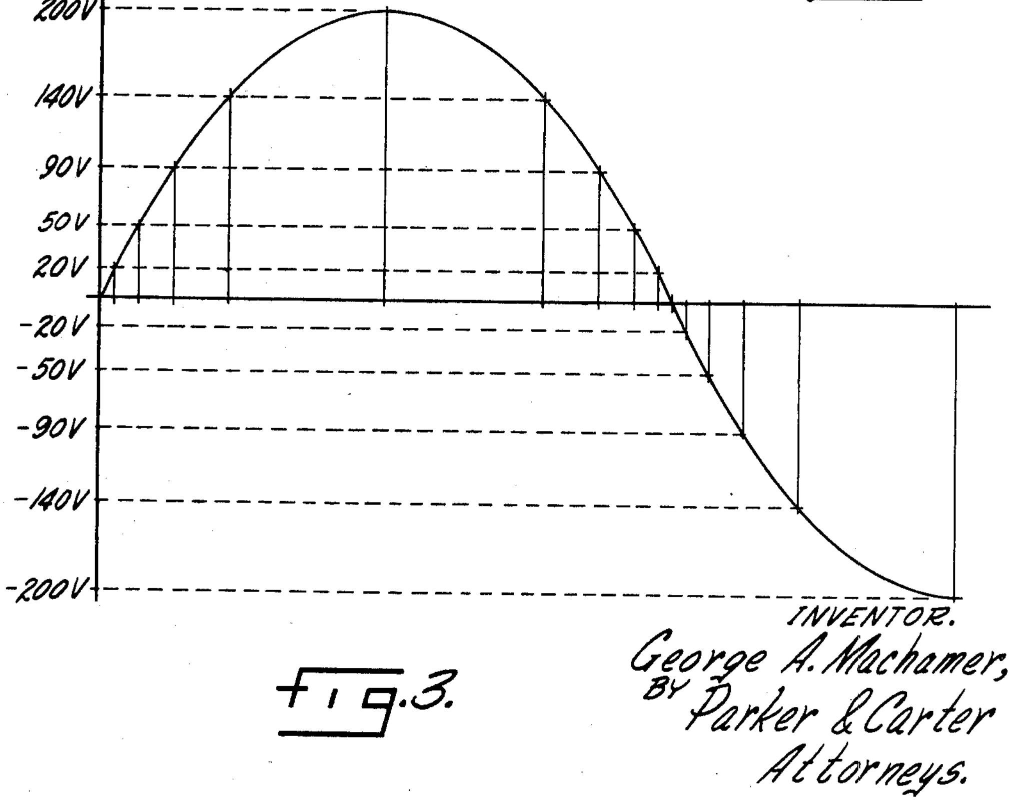
FIG. 3 is a signal diagram illustrating one mode of operation of the circuits disclosed herein.

FIG. 3 illustrates an applied sine wave and the conduction angles of the various tubes. The periods of conduction of each of tubes 20—28 is illustrated in FIG. 3 as is the period of conduction of tubes 30—38. As shown in FIG. 3, the tubes do not conduct for equal periods of time. The conduction period of each tube can, of course, be controlled by the applied bias. The invention should not be limited to a push-pull-type amplifier as only one bank of tubes may be used and the tubes can still conduct through a complete cycle of an applied signal. The bias applied to each tube will determine its period of conduction.

Obviously the invention has wider application than when the input signal is a sine wave. By using tubes arranged as disclosed herein, in which adjacent tubes conduct for different amplitudes of the applied signal, any input signal can be followed with the result that the output will receive an amplified version of the input, or at least an amplified version of a portion of the input. What is important is that each of the tubes conduct for different periods, the tubes do not all conduct at the same time.

The conduction periods of the tubes may overlap, or there may be distinct periods of nonconduction between periods of conduction. The former arrangement may cause slight loss in efficiency. In some application, each stage may include several tubes in parallel for greater power output.

Figure 2:
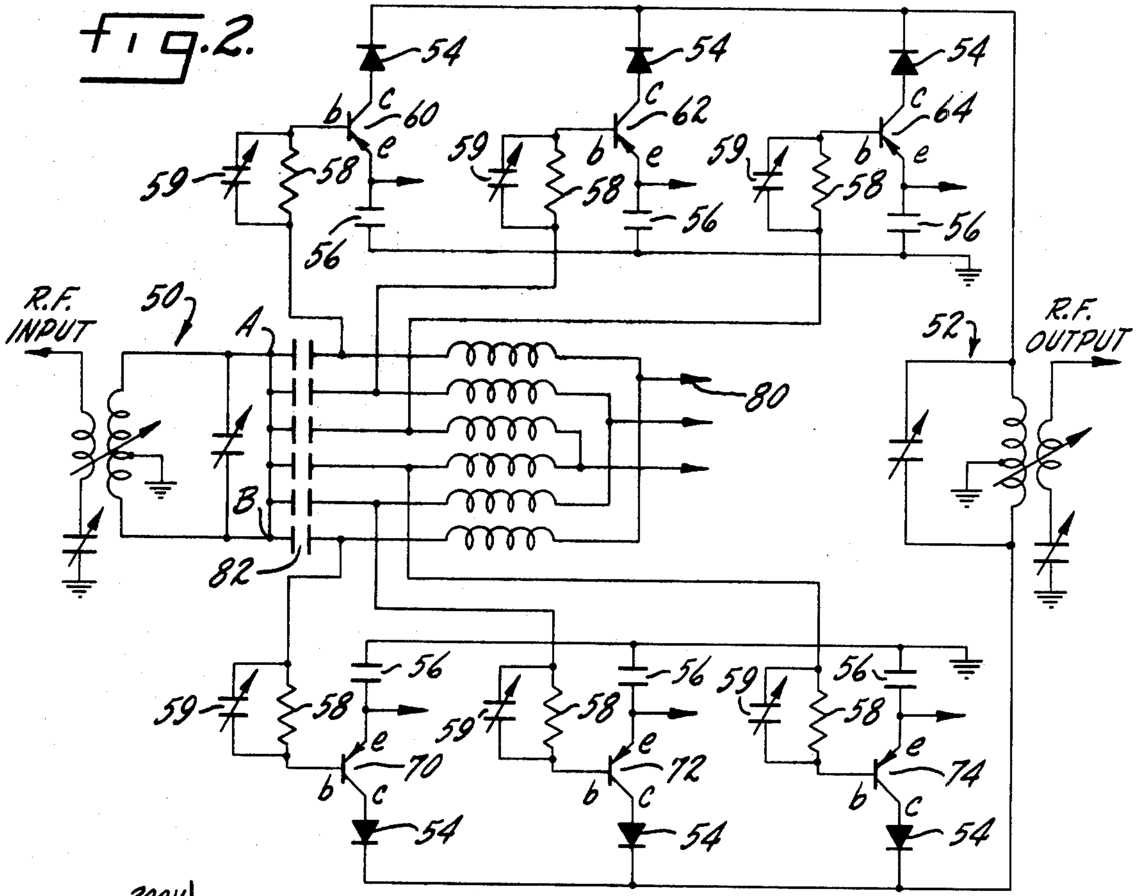
FIG. 2 is an electrical schematic illustrating a second form of the invention.

Turning to FIG. 2, a similar circuit is shown using semiconductor devices or transistors. Only three transistors have been shown, and it should be obvious that the number of stages is not important to the invention. Any number of stages over two is satisfactory. The input circuit is indicated at 50, and the output circuit at 52. The collectors of transistors 60, 62 and 64 may be connected through diodes 54 to one side of the output tank circuit 52. The collectors of transistors 70—74 may be connected through similar diodes 54 to the other side of the output tank circuit 52. The emitters of the transistors may be connected to a biasing voltage, merely indicated by an arrow in FIG. 2, as no illustrative voltage values are given. The emitters may then be connected through blocking condensers 56 to ground. The bases of all of the transistors are connected through a voltage divider circuit made up of a resistor 58 and a variable condenser 59. Some applications may not use such a voltage divider circuit, however, one is illustrated herein. The bases are then connected to biasing voltages indicated by arrows 80, with one-half of the bases, those from transistors 60—64, being connected through condensers 82 to point A or the top side of the input tank circuit 50. The bases of transistors 70—74 are connected through blocking condenser 82 to point B or the bottom side of the input tank circuit 50.

The operation of the circuit illustrated in FIG. 2 is the same as that illustrated in FIG. 1, with the exception that transistors are substituted for tubes. Obviously the voltages applied to the elements of the transistors will be different from those applied to the tubes; nevertheless, operation is generally the same.

The invention should not be limited to the precise circuit configuration shown. Tetrodes and pentodes may in some applications be substituted for the triodes of FIG. 1. Also, in some applications thyratrons or other types of gas tubes may be satisfactory. In like manner, the invention should not be limited to transistors of the type shown, as other semiconductor devices may be satisfactory.

In like manner, it is not always necessary to have a grid input when using vacuum tubes or to have a base input when using transistors. Other circuit configurations may be satisfactory. What is important is to provide a circuit arrangement in which the bias applied to a succession of electronic amplifying devices is so arranged that the devices will conduct at different amplitudes of the input signal.

At times it may be advantageous, rather than having one tube or one amplifying device cut off or reach saturation when the succeeding device starts, to have the devices overlap. In other words, one device might conduct for a portion of the conduction period of the preceding and succeeding devices. Such a circuit arrangement may provide a smoother output. Where mere power is the desire at the output, the pulses of current from each amplifying device may be distinctly separated as this will reduce the conduction angle of each amplifying device which in turn will make the overall amplifier more efficient.

Various additional circuitry may be added to either of the configurations shown to more efficiently provide power in any class of amplifier operation. In some applications it may be desirable to provide a phase shift between the voltages applied to successive grids.

The invention has been described as having adjacent stages conduct in succession. Obviously this does not limit the invention to a circuit arrangement in which stages that are physically adjacent conduct in succession. Rather, stages that are biased with adjacent voltages conduct in succession.

As mentioned above, more than one of the amplifier stages may be combined into a single integral unit. One example of such an arrangement is the case in which a single glass envelope contains a number of triode units. Another example is where a single semiconductor unit contains a number of separate transistor amplifying devices, each having a common element, for example the collector. A third example of such a unit, and one which is usable in the microwave frequencies, would include a resonant cavity as the amplifier output, analogous to the plate of a common triode. Extending radially outwardly from the cavity would be a series of dividers with the space between dividers providing a passage for electrons to reach the resonant cavity. The grids, each of which would be individually positioned in an electron passage between a pair of dividers, would all be a part of a transmission line with the excitation for the grids being provided by traveling waves on the line. Elements could be inserted in each passageway to provide the function of a cathode and there could be suitable means provided for biasing both the cathodes and grids. Electrons would flow from each of the cathodes, past each of the grids and into the resonant cavity in accordance with the bias placed on the cathodes and grids and in accordance with the excitation provided on the grids by the traveling waves. In effect, the arrangement described would be a series of amplifying stages, with each stage including a cathode, grid and the common resonant cavity. The dividers between stages would maintain the electrons in their predetermined path toward the cavity and would prevent the electrons from flowing from one passage to another. Such an arrangement would provide amplification at microwave frequencies in the same manner as the amplifiers described above. The period of conduction of each stage and its time of conduction relative to the other stages could be controlled by the bias. In some applications, the resonant cavity could assume the functions of a cathode rather than that of an anode.

It is also possible to provide a circuit arrangement in which the bias would be applied to the successive grids by means of separate pulses. The time of application of the pulses would be coordinated so that each stage would conduct over its appropriate period. The pulses could be provided by the addition of harmonics to a fundamental sine wave, for example. The phase and amplitude of the harmonics could be controlled to provide pulses of appropriate amplitude and timing. Normally the amplifying stages each would receive the same amplitude of bias voltage, but at different time periods. Such an arrangement could utilize conventional tubes, which tubes would be allowed to conduct when the cathode-to-plate voltage was low.

Whereas the preferred form of the invention has been shown and described herein, it should be realized that there are many modifications, substitutions and alternations thereto within the scope of the following claims.

I claim:

1. In a high efficiency amplifier, an input circuit, an output circuit, a succession of electronic amplifying stages, each having at least a first element, a second element, and a third element each of the first elements being connected to the output circuit, each of the second elements having a common connection, and each of the third elements being connected to the input circuit, circuit means for biasing the third element in each stage, with the bias applied to one stage being intermediate the bias applied to adjacent stages, whereby each stage conducts only when the input signal is between predetermined amplitudes, said amplitudes being different from the conduction amplitudes of all other stages, with the conduction amplitudes of each stage minimally overlapping the conduction amplitudes of adjacent stages whereby substantially only one stage is conducting at any given input amplitude with the minimal overlapping of adjacent stages being only for the production of a substantially continuous signal at the output circuit, each of the stages being biased to conduct, from a predetermined minimum value, up to about saturation.

2. The circuit of claim 1 further characterized by circuit means for biasing an additional element in each stage, said additional elements all being the same.

3. The structure of claim 1 further characterized in that said electronic stages are of the semiconductor type.

4. The circuit of claim 1 further characterized in that said electronic stages are electronic tubes.

5. The circuit of claim 1 further characterized in that each of said electronic amplifying stages are triode tubes having an anode, cathode and grid, with a bias being applied to the grid of each device, and further including circuit means for biasing one of the cathode and anode in each stage.

6. The circuit of claim 1 further characterized in that each of said electronic amplifying stages are transistors, having a collector, emitter and base, with the base of each transistor being connected to said input circuit and with a bias being applied to the base of each transistor.

7. The circuit of claim 6 further characterized in that the collectors of each of said transistors are connected to said output circuit.